US006407398B1

(12) United States Patent
Kurokawa et al.

(10) Patent No.: US 6,407,398 B1
(45) Date of Patent: Jun. 18, 2002

(54) ELECTRON BEAM EXPOSURE APPARATUS AND EXPOSURE METHOD

(75) Inventors: Masaki Kurokawa; Tatsuro Ohkawa; Yoshihisa Ooae, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/442,588

(22) Filed: Nov. 17, 1999

(30) Foreign Application Priority Data

Nov. 17, 1998 (JP) ............................................ 10-326652
Dec. 2, 1998 (JP) ............................................ 10-342848

(51) Int. Cl.$^7$ ............................ H01J 37/304; G03F 9/00
(52) U.S. Cl. ................................. 250/492.22; 250/491.1
(58) Field of Search ......................... 250/492.2, 492.22, 250/492.3, 310, 311, 427, 491.1

(56) References Cited

U.S. PATENT DOCUMENTS

| 5,757,015 A | * | 5/1998 | Takemoto et al. | ........ 250/491.1 |
| 5,969,365 A | * | 10/1999 | Takemoto et al. | ........ 250/491.1 |
| 6,137,111 A | * | 10/2000 | Yamada et al. | .......... 250/492.2 |

FOREIGN PATENT DOCUMENTS

EP         0 201 858     11/1986   ................. 37/304

* cited by examiner

*Primary Examiner*—John R. Lee
*Assistant Examiner*—Anthony Quash
(74) *Attorney, Agent, or Firm*—Christie, Parker & Hale, LLP

(57) ABSTRACT

An electron beam exposure apparatus, enabling detection of the height of a sample simply and with a high accuracy, including an electron gun, a converging unit able to converge an electron beam on a sample and make the focus position dynamically move, a deflecting unit for deflecting the electron beam, a movement mechanism for carrying and moving the sample, a deflection data and incident angle relationship storing circuit for storing the incident angle of the electron beam on the sample when the electron beam is deflected by the deflecting unit, a mark position detecting unit for detecting changes in reflected electrons at a mark provided on the sample when scanning the mark by the electron beam and thereby detecting the position of the mark, a mark position difference calculating unit for using the mark position detecting unit to scan a first mark provided on the sample by an electron beam of a first incident angle and a second mark in a predetermined positional relationship with the first mark by an electron beam of a second incident angle different from the first incident angle to detect the positions of the first and second marks and calculating the difference in the positional relationship of the first and second marks detected and the predetermined positional relationship, and a height calculating unit for calculating the height of the sample from the difference of the positional relationship of the first and second marks calculated and the relationship of the deflection data and incident angle.

12 Claims, 15 Drawing Sheets

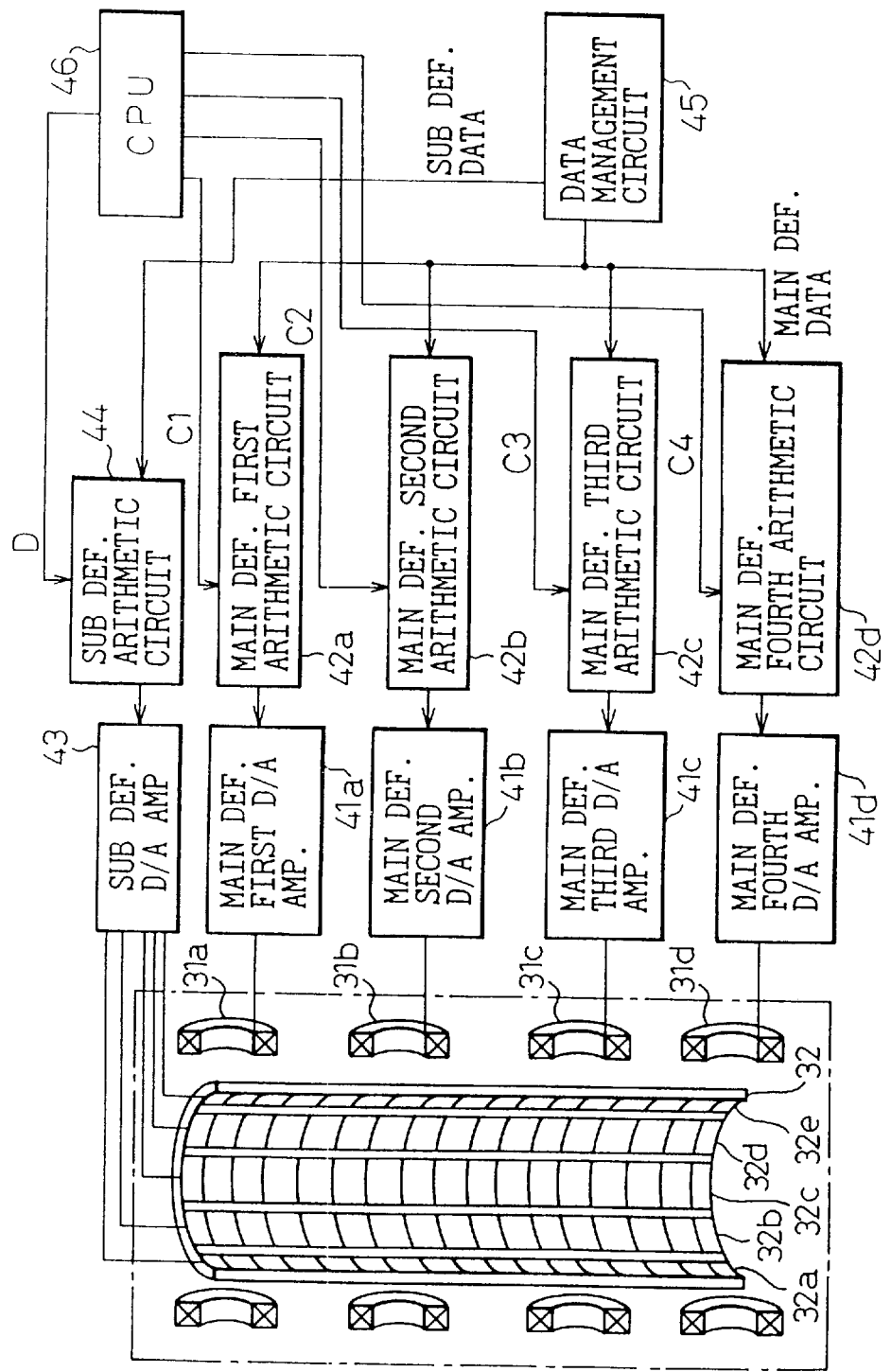

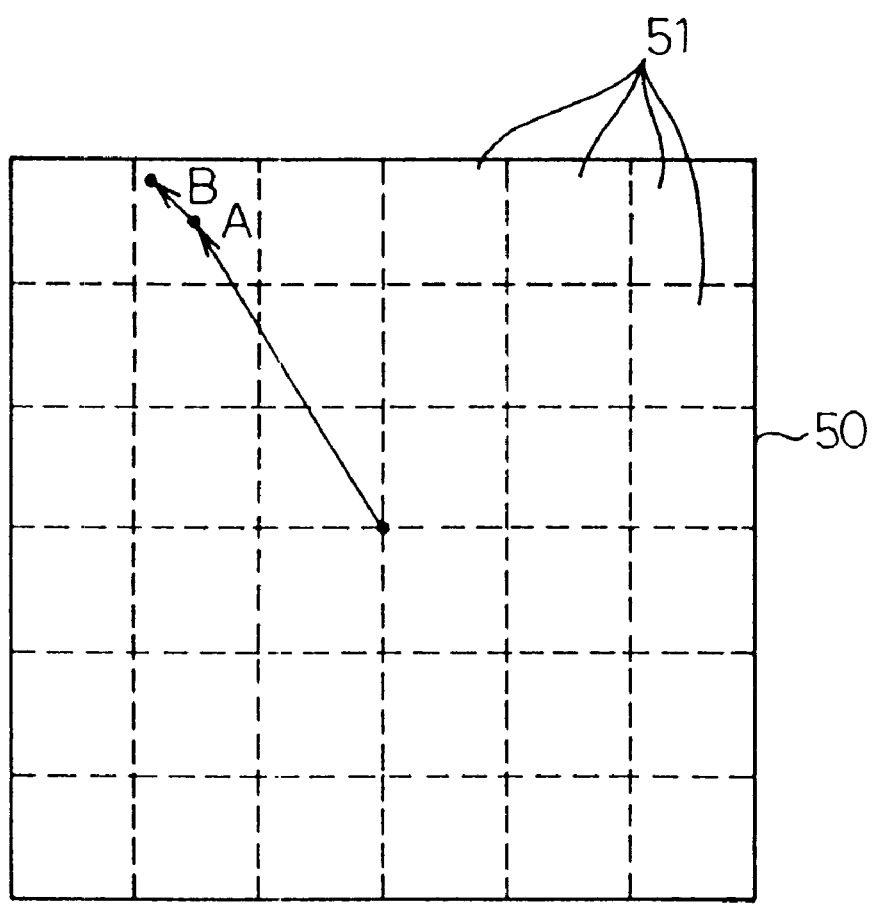

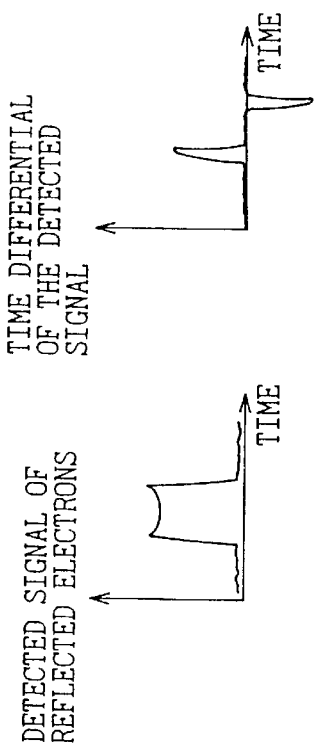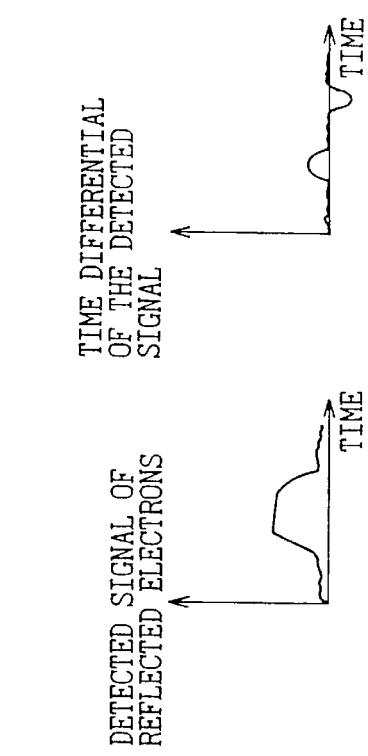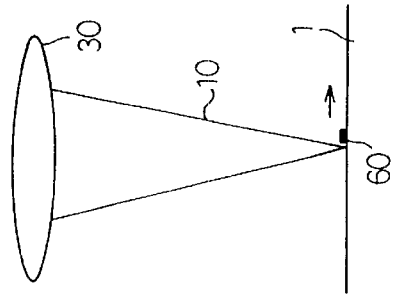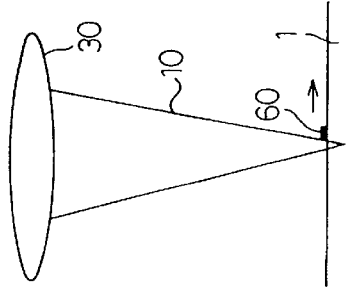

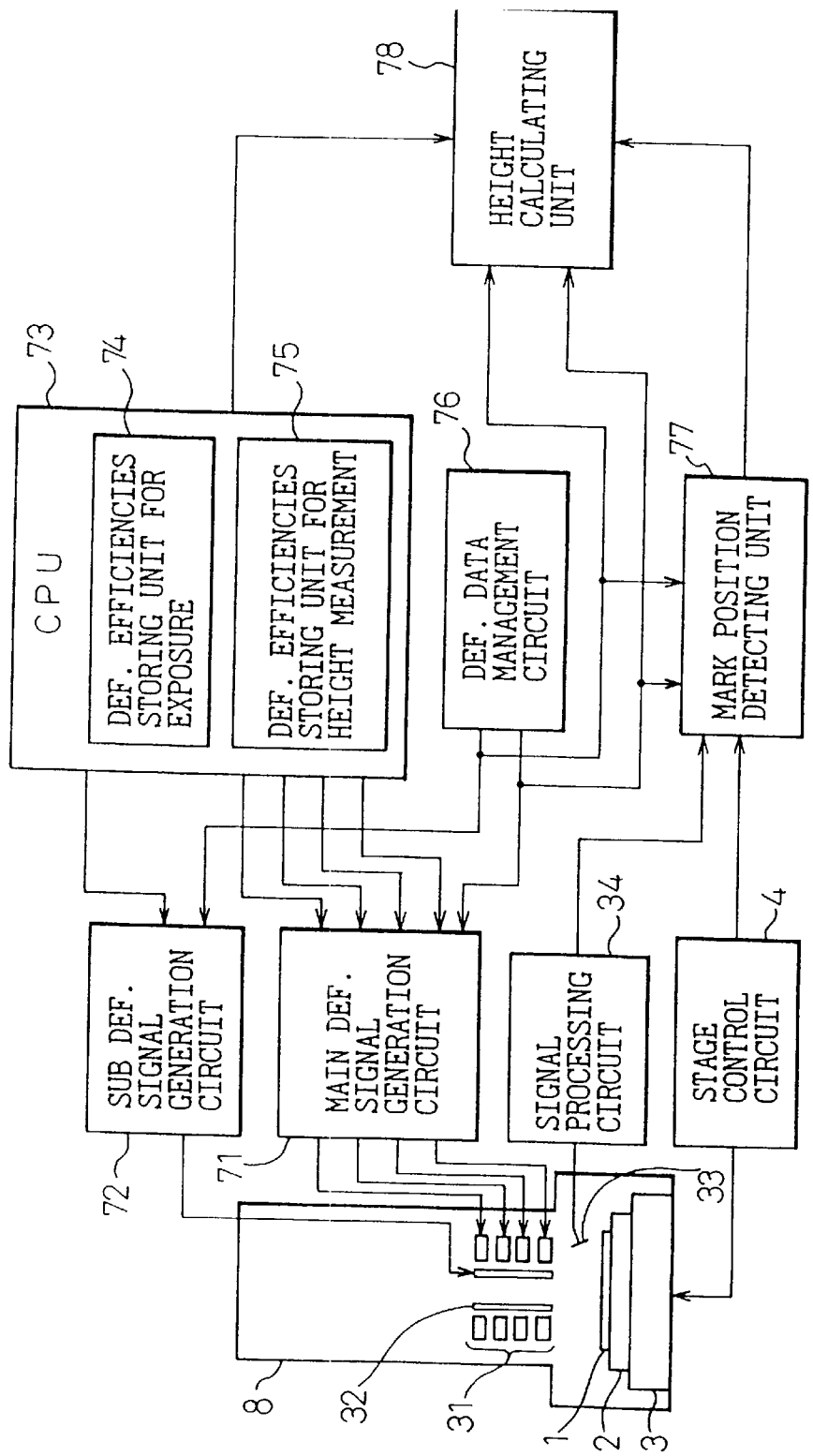

ELECTRON BEAM EXPOSURE APPARATUS AND EXPOSURE METHOD

BACKGROUND OF THE INVENTION

1. Field of the Invention

The present invention relates to an electron beam exposure apparatus, more particularly to a technique for measurement of the height of a sample surface in an electron beam exposure apparatus.

2. Description of the Related Art

Advances in microprocessing technology have led to greater integration densities of semiconductor integrated circuits and have resulted in increasingly severe demands on the performance of microprocessing technology. In particular, in exposure, the limit is expected to be reached in the optical exposure technology used in the conventional steppers and the like. Electronic beam exposure is a technique which may well form the basis for the next generation of microprocessing in place of optical exposure.

Electron beam exposure apparatuses include ones of variable aperture (variable size rectangular aperture) exposure, block exposure, and multibeam exposure. Here, the explanation will be given taking as an example the block exposure system, but the present invention is not limited to this. The block exposure system is one in which a pattern of repeating unit graphics is given to a transmission mask, an electron beam is made to pass through it to generate the unit patterns all at once, then these are connected and the repeating unit graphics exposed.

FIG. 1 is a view of the configuration of a beam irradiating system in an electron beam exposure apparatus of the block exposure system. In FIG. 1, reference numeral 11 indicates an electron gun emitting the electron beam, 12 a first convergence lens for converging the electron beam from the electron gun 11 to a parallel beam, 13 an aperture for forming the parallel beam passing through it into a predetermined shape, 14 a second convergence lens for focusing the formed beam, 15 a shaping use deflector, 16 a first mask deflector, 17 a deflector for dynamically correcting astigmatism due to the mask, 18 a second mask deflector, 19 a mask use convergence coil, 20 a first shaping lens, 21 a block mask moved by a stage 21A, 22 a second shaping lens, 23 a third mask deflector, 24 a blanking deflector for controlling the on/off state of the beam, 25 a fourth mask deflector, 26 a third lens, 27 a circular aperture, 28 a reduction lens, 29 a dynamic focus coil, 30 a projection lens, 31 an electromagnetic main deflector, 32 an electrostatic sub deflector, and 33 a reflected electron detector for detecting reflected electrons of the electron beam irradiated on a sample 1 and outputting a reflected electron signal. An electron beam 10 is converged by the projection lens 30 on to a sample (wafer) 1 placed on a stage 2. The stage is made to move two-dimensionally in a plane vertical to the electron beam 10. The above parts are housed in a housing called an electron optical mirror tube (column). The inside of the column is evacuated for the exposure. The electron beam exposure apparatus further has an exposure controller for controlling the parts of the column so as to expose a desired pattern, but the explanation of this will be omitted here.

FIG. 2 is a more detailed view of the configuration of the parts of the main deflector 31 and the sub deflector 32. As shown in FIG. 2, the main deflector 31 is comprised of four electromagnetic deflectors 31a to 31d assembled together. Main deflection data output from a data management circuit 45 is multiplied with deflection efficiencies C1 to C4 at a main deflection first processing circuit 42a to main deflection fourth processing circuit 42d, then converted to analog signals and then amplified at the main deflection first D/A amplifier 41a to main deflection fourth D/A amplifier 41d and supplied to the electromagnetic deflectors 31a to 31d. The electromagnetic deflectors 31a to 31d are made to generate magnetic fields and deflect the electron beam 10 in accordance with the signals supplied to them. For example, as shown in FIG. 3A, one electromagnetic deflector is used to deflect the beam and change its position, then another electromagnetic deflector is used to return it to its original direction thereby enabling the position of emission of the electron beam to be changed, but keeping the direction of emission always vertical to the sample 1. By doing this, even if the height of the sample 1 changes, the exposure position will substantially remain unchanged, so there is the advantage that deterioration of the exposed image can be reduced.

The sub deflector 32 for example is comprised of a ceramic tube on the inner surface of which are formed eight thin metal films extending in the axial direction and serving as electrodes. By supplying voltage to the facing electrodes, an electric field is formed. The incident electron beam is deflected by the electrostatic field. The sub deflection data output from the data management circuit 45 is multiplied with the deflection efficiency D at the sub deflection processing circuit 44, then converted to an analog signal and amplified at the sub deflection D/A amplifier 43 and supplied to the electrodes. Note that for convenience in illustration, only one of each of the sub deflection processing circuit 44 and the sub deflection D/A amplifier 43 is shown, but there are eight electrodes and therefore in actuality eight sets of the sub deflection processing circuits 44 and sub deflection D/A amplifiers 43 are provided corresponding to the electrodes. Deflection efficiencies D1 to D8 are also individually set. As shown in FIG. 3B, the electron beam fired into the sub deflector 32 is gradually deflected and emitted at a certain emission angle.

The deflection efficiencies C1 to C4 and D1 are set so as to give deflection positions proportional to the main deflection data and the sub deflection data given.

In general, the main deflector 31 has a larger deflection range, but a slower response speed compared with the sub deflector 32. Therefore, in the electron beam exposure apparatus, to improve the exposure efficiency, the main deflector 31 and the sub deflector 32 are combined as shown in FIG. 1 and FIG. 2. When performing exposure, as shown in FIG. 4, the deflection range (in actuality a somewhat smaller range) 50 of the main deflector 31 is divided into a plurality of sub regions 51, the deflection position A of the main deflector 31 is made the center of the sub regions 51, and the pattern inside a sub region 51 is exposed while changing the amount of deflection B of the sub deflector 32. Note that the same applies in the case of successively exposing sub regions 51 of the same column while moving the stage.

In the case of an electron beam exposure apparatus used in the process of production of a semiconductor device a semiconductor wafer is used as the sample. A resist is coated on the semiconductor wafer and a pattern is drawn on it by an electron beam. The thickness of the semiconductor wafer is uneven and some warping etc. exists as well. Further, there are changes in height along with movement of the stage. Therefore, there is unevenness in the surface position of the semiconductor wafer placed on the stage 2, that is, the height of the sample. Therefore, it is necessary to measure the height of the sample and adjust the electron beam so that it converges at that height, that is, to adjust the focus position. The focus position of the electron beam exposure apparatus is mainly determined by the projection lens 30, but the focus position can be changed within a small range, but at a faster speed by the dynamic focus coil 29. Therefore, the focus position can be adjusted in accordance with changes in height of the sample by using the dynamic focus coil 29. Note that in an electron beam exposure apparatus, there is the phenomenon called coulomb interaction in which the electrons of the electron beam react with each other resulting in loss of focus of the beam. The focus position changes according to the amount of the electron beam irradiated. The dynamic focus coil 29 is mainly used for the purpose of correcting a change in the focus position, but is also used for adjustment of the focus position in accordance with a change in height of the sample.

The method for measurement of the height of a sample used in the past will be explained next with reference to FIG. 5A to FIG. 5F. A mark 60 is prepared on the surface of the sample 1 in advance using a substance or structure with a different electron reflectance. Further, the reflected electron signal is detected by a reflected electron detector 33 while scanning this mark by an electron beam converged by the projection lens 30. The scanning is performed by changing the amount of deflection of the sub deflector 32 for example. As shown in FIG. 5A, when the focus position is on the surface of the sample 1, the amount of reflected electrons changes rapidly at the edge portion of the mark 60 as shown in FIG. 5B in accordance with the scanning and the signal obtained by differentiation of the waveform exhibits a large peak absolute value as shown in FIG. 5C. As opposed to this, as shown in FIG. 5D, when the focus position is not on the surface of the sample 1, the amount of reflected electrons changes slowly as shown in FIG. 5E according to the scanning and the signal obtained by differentiation of the waveform exhibits a small peak absolute value as shown in FIG. 5F. Therefore, the processing for performing the scanning while changing the focus position near what appears to be the surface of the sample and measuring the amount of the reflected electrons in the above way is performed a minimum of five times and the focus position when the absolute value of the differentiated waveform becomes the largest is made the height of the sample.

When the focus position changes, the deflection efficiencies C1 to C4 and D (D1 to D8) of the main deflector 31 and the sub deflector 32 also change. For example, when the axis of the main deflector 31 or sub deflector 32 becomes inclined in accordance with mounting error, the optical axis also becomes inclined. If the optical axis becomes inclined, the center position becomes offset in accordance with the focus position. This error is designed to be made as small as possible, but cannot be made completely zero. Therefore, the correspondence between the height of the sample and the deflection efficiency, that is, how the deflection efficiencies C1 to C4 and D should be changed when the focus position changes, is found in advance. Therefore, at the time of exposure, the deflection efficiency and the height of the sample are measured at one location serving as a reference on the sample (semiconductor wafer), the height is measured at different points on the sample, the value to be set at the dynamic focus coil 29 is determined for each die (semiconductor chip), and the correction value for the deflection efficiency is calculated from the correspondence and the correction made.

As explained above, in the past, the height of the sample was detected by the method shown in FIG. 5A to FIG. 5F, but this method requires that the focus position be changed and scanning performed at least five times so there was the problem of a long time required for the measurement. If the height of the sample is measured by this method at different points on a sample, a considerable time is required overall.

Further, this method has the problem that since it observes the magnitude of the change in the amount of the reflected electrons at the edge of the mark at the time of scanning by the electron beam, that is, the time differential of the amount of the reflected electrons, so the measurement accuracy is not that good. In particular, the amount of reflected electrons itself is small and it is difficult to improve the accuracy more than that by a mark on an unstable silicon wafer.

Further, when changing the focus position, there is also the problem that axial deviation of the optical system occurs, the electron beam deviates from the mark depending on the shape of the mark, and the focus position is not always achieved when the magnitude of the change of the amount of the reflected electrons becomes maximum.

SUMMARY OF THE INVENTION

An object of the present invention is to realize an electron beam exposure apparatus enabling detection of the height of a sample more simply and with a higher accuracy.

To achieve the above object, in the electron beam exposure apparatus and exposure method of the present invention, first and second marks in a predetermined positional relationship are scanned by an electron beam at different incident angles to detect the positions of the first and second marks, and the heights of the first and second marks, that is, the height of the sample, are calculated from the difference between the positional relationship of the first and second marks detected and the predetermined positional relationship and the incident angles.

That is, according to a first aspect of the present invention, there is provided an electron beam exposure apparatus comprised of an electron gun for emitting an electron beam, a converging unit able to converge an electron beam on a sample and make the focus position dynamically move, a deflecting unit for deflecting the electron beam, a movement mechanism for carrying and moving the sample, a deflection data and incident angle relation storing circuit for storing the incident angle of the electron beam on the sample when the electron beam is deflected by the deflecting unit, a mark position detecting unit for detecting a change in reflected electrons at a mark provided on the sample when scanning the mark by the electron beam and thereby detecting the position of the mark, a mark position difference calculating unit for using the mark position detecting unit to scan a first mark provided on the sample by an electron beam of a first incident angle and a second mark in a predetermined positional relationship with the first mark by an electron beam of a second incident angle different from the first incident angle to detect the positions of the first and second marks and calculating the difference in the positional relationship of the first and second marks detected and the predetermined positional relationship, and a height calculating unit for calculating the height of the sample from the difference of the positional relationship of the first and second marks calculated and the relationship of the deflection data and incident angles.

FIG. 6 is a view for explaining the principle of the present invention. Assume that a first mark 60a and a second mark 60b are provided in a predetermined positional relationship on the sample (wafer), for example, exactly a distance L apart from each other. The first mark 60a is scanned by an electron beam 10 of an incident angle α to detect the position of the first mark 60a, and the second mark 60b is scanned by an electron beam 10 of an incident angle β to detect the position of the second mark 60b. When at least one of the incident angles α and β is not zero, if a mark is not at the focal plane (focus position), the difference in the detected positions of the first and second marks is L, but if a mark is displaced from the focal plane, a deviation ΔL occurs at the detected position. This deviation ΔL is determined by the deviation Δh of the height of the sample at incident angles α and β. Therefore, if the difference ΔL between the detected difference of the positions of the first and second marks and the predetermined distance L is calculated, the deviation Δh of the height of the sample can be found from the difference ΔL and the incident angles α and β. Therefore, it is necessary that at least one of the incident angles α and β not be zero. Further, it is preferable from the viewpoint of computation that one of the incident angles α and β be zero or that the incident angles α and β be values opposite in sign. For example, if β is zero, ΔL=Δh·tan α, while if α=β, ΔL=2Δh·tan α.

If the deflecting unit has a plurality of deflectors and the amount of deflection is determined by a combination of the amounts of deflection of the deflectors, an electron beam can be deflected to the same deflection position by different incident angles. In this case, it is possible to detect deviation in the height of the sample even by detection of the position of the same mark at the same position.

FIG. 7A and FIG. 7B are views for explaining the principle of measurement of deviation in the height of a sample by scanning the position of the same mark at the same position by an electron beam with different incident angles so as to detect its position. Assume that the deflecting unit is comprised of a first and second deflector. For example, as shown in FIG. 7A, when deflecting from a center O to a position O', there is a first combination of an amount of deflection A1 of the first deflector and an amount of deflection B1 of the second deflector and a second combination of an amount of deflection A2 of the first deflector and an amount of deflection B2 of the second defector. As shown in FIG. 7B, the path of the electron beam 10 in the case of the first combination is 10a and the path of the electron beam 10 in the case of the second combination is 10b. The incident angles to the sample differ.

When a sample is at the height shown by Q, the paths 10a and 10b of the two electron beams match at the point Q0 on the sample, but when a sample is at the height shown by P, the paths 10a and 10b of the two electron beams are ones where the beams strike the sample at the positions of P1 and P2, while when the sample is at the height shown by R, the paths 10a and 10b of the two electron beams are ones where the beams strike the sample at the positions of R1 and R2. The difference in the positions of P1 and P2 is determined by the difference h1 of the heights of P and Q and the difference of the incident angles, while the difference in the positions of R1 and R2 is determined by the difference h2 of the heights of Q and R and the difference of the incident angles. The incident angles of the paths 10a and 10b can be calculated from the deflection efficiency and the deflection data and stored in advance in a relation storing circuit. If assuming now that a sample is at a height shown by P, when the mark is detected by the first combination, P1 is detected as the position of the edge of the mark, while when the mark is detected by the second combination, P2 is detected as the position of the edge of the mark, so the height h1 may be found from the difference of P1 and P2 and the incident angles of the path 10a and 10b. The same applies when a sample is at a height shown by R.

As explained above, according to the present invention, since the height of the sample can be measured by scanning by two combinations of different incident angles, the number of scans can be reduced compared with the related art. Further, according to the present invention, since the position of change of the amount of reflected electrons (reflected electron signal) is detected, the measurement accuracy is better compared with the related art where the time differential of the amount of reflected electrons was detected.

Further, since the same mark is detected by scanning by two combinations of different incident angles, the small error in the position of the mark has no effect on measurement accuracy.

Note that if the amounts of deflection A1 and B2 and A2 and B1 are equal, A1 and B1 are opposite in sign, and A2 and B2 are opposite in sign, O' matches O and the height of the center position is measured. Normally, when the amounts of deflection are opposite in sign, the incident angles are also opposite in sign, so in this case the paths of the two electron beams become symmetric with the optical axis.

As explained above, the deflecting unit of the electron beam exposure apparatus is a combination of a main deflector having a large deflection range and a sub deflector having a smaller deflection range than the main deflector and performs exposure in the manner shown in FIG. 4. In this case the main deflector corresponds to the first deflector and the sub deflector to the second deflector.

Further, as explained in FIG. 2 and FIG. 3A, the main deflector is comprised of a plurality of electromagnetic deflectors. The direction of progression of the electron beam is changed once, then restored again to its original direction. When deflection is performed by the main deflector, even if the position of incidence to the sample changes, the electron beam is made to strike the sample perpendicularly. Due to this, there is the advantage that even if there is a deviation in the height of a sample, the position at which the electron beam strikes it will not deviate. When detecting deviation in the height of a sample by application of the present invention, the incident angle of the electron beam to the sample is preferably as large as possible. Therefore, when measuring the height of a sample, the incident angle of the electron beam to the sample is made to become larger, while when irradiating the beam in a pattern, the incident angle of the electron beam to the sample is switched to become smaller.

As shown in FIG. 2, the deflecting unit is provided with a plurality of processing circuits able to output deflection data multiplied with coefficients of deflection efficiency and to set the coefficients of deflection efficiency independently and freely for the deflectors and an analog processing circuit receiving the output of the processing circuits and generating drive signals to be supplied to the corresponding deflectors, so in the present invention there is provided an exposure deflection efficiency storing circuit for calculating and storing the combination of coefficients of deflection efficiency for exposure by which the electron beam is deflected by exactly an amount of deflection defined by the deflection data and giving the minimum incident angle of the electron beam to the sample surface and a height measurement deflection efficiency storing circuit for calculating and storing the combination of coefficients of deflection efficiency for height measurement by which the electron beam is deflected by exactly an amount of deflection defined by the deflection data and giving the maximum incident angle of the electron beam to the sample surface. When exposing a pattern on the sample, the deflection is performed by setting coefficients of deflection efficiency for exposure in the plurality of processing circuits. When scanning the first and second marks for detection of the height of a sample, the deflection is performed by setting the coefficients of deflection efficiency for height measurement in the plurality of processing circuits.

The coefficients of deflection efficiency for height measurement are for example all made zero except for one. If only one coefficient of deflection efficiency in the processing circuits of the plurality of deflectors is made a value other than zero and the other coefficients of deflection efficiency of the processing circuits are made zero, return of the direction of the electron beam is not possible, so the incident angle becomes a value other than zero. If just one of the coefficients of deflection efficiency of the plurality of processing circuits is made a value other than zero and the other coefficients are all made zero, computation of the combination of deflection efficiencies for height measurement becomes easy.

Further, it is preferable to correct the deflection efficiency for exposure in accordance with the height of the sample detected. Therefore, provision is made of a deflection efficiency correction value storing circuit for storing in advance the correction data of the deflection efficiency for exposure in accordance with the height of the sample and a deflection efficiency correcting unit for calculating the correction value from the calculated height and the correction data of the deflection efficiency stored in the deflection efficiency correction value storing circuit and correcting the deflection efficiency of the processing circuit at the time of pattern exposure.

In this case, there are the same number of combinations of coefficients of the deflection efficiency where only one coefficient is a value not zero and the other coefficients are all zero as the number of deflectors. It is preferable to evaluate the sharpness of the image of the electron beam on the sample for each combination and make the combination giving the smallest reduction in sharpness among the combinations of coefficients of deflection efficiency giving the same incident angle the combination of the coefficients of deflection efficiency for height measurement. By doing this, the position of the position detecting mark can be accurately detected.

Note that even when determining the combination of coefficients of deflection efficiency for height measurement so that the incident angle becomes a desired value on the condition that a plurality of coefficients being values other than zero, it is preferable to set the combination to give the best sharpness in the same way.

When determining the combination of coefficients of deflection efficiency for exposure, it is determined on the condition that the incident angle of the electron beam on the sample surface always be zero regardless of the amount of deflection and the sharpness of the image of the electron beam on the sample be made the best.

BRIEF DESCRIPTION OF THE DRAWINGS

The features and advantages of the electron beam exposure apparatus and method according to the present invention will be more clearly understood from the following description taken in conjunction with the accompanying drawings, in which:

FIG. 2 is a view of the configuration of a deflecting unit of an electron beam exposure apparatus of the related art;

FIG. 4 is a view explaining the state of deflection of an electron beam by a deflecting unit of the related art comprised of a combination of a main deflector and a sub deflector;

FIG. 5A to FIG. 5F are views explaining the method of height measurement of the related art;

FIG. 12 is a block diagram of the schematic configuration of an electron beam exposure apparatus of a second embodiment of the present invention;

DESCRIPTION OF THE PREFERRED EMBODIMENTS

Below, an explanation will be made of embodiments in the case of application of the present invention to an electron beam exposure apparatus of the related art explained with reference to FIG. 1 to FIG. 4, but the present invention is not limited to an electron beam exposure apparatus of this configuration. In a first embodiment of the present invention, the position is detected by scanning the same mark at the same position without movement by an electron beam at different incident angles.

Figure 8:
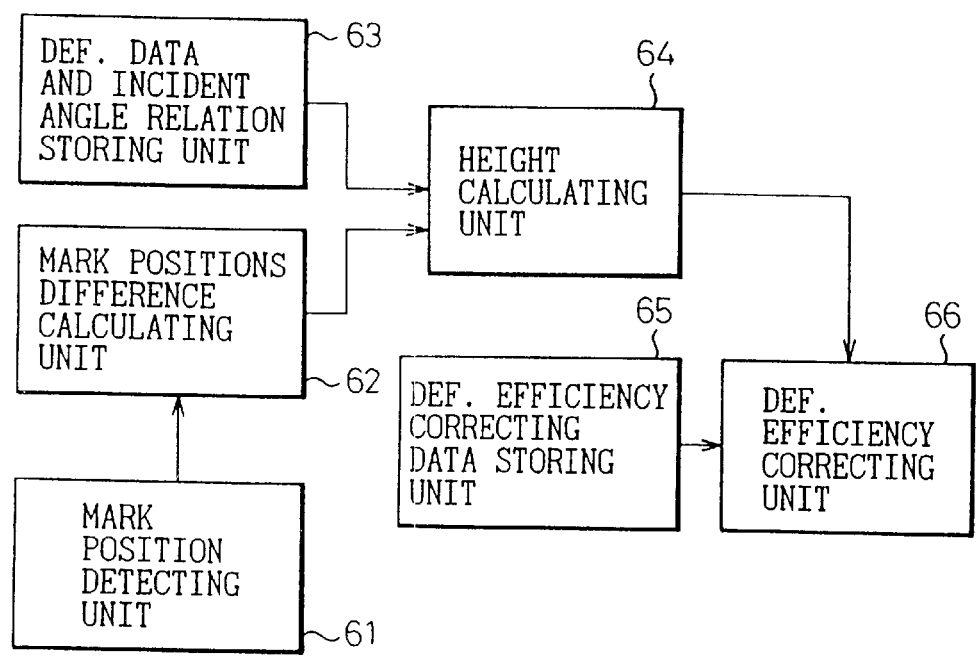
FIG. 8 is a view of the configuration of a portion for height measurement of a sample in an electron beam exposure apparatus of a first embodiment of the present invention.

FIG. 8 is a view of the configuration of the portion of the electron beam exposure apparatus of the first embodiment of the present invention relating to the height measurement of a sample. As illustrated, this portion is comprised of a mark position detecting unit 61 for using an electron beam to scan a mark provided on a sample and formed by a substance or structure with a different electron reflectance, detect the reflected electrons, detect the timing by which the electron beam passes over the edge of the mark, and thereby detect the edge position of the mark; a mark position error detecting unit 62 for detecting the difference in the edge position of the mark detected when scanning the same mark by two combinations of amounts of deflection of the main deflector and the sub deflector at different incident angles using the mark position detecting unit 61; a deflection data and incident angle relation storing unit 63 for storing the combinations of amounts of deflection by the first and second deflecting units and the deflection data and incident angle relation of the incident angle of the electron beam to the sample; a height calculating unit 64 for calculating the height of the sample from the calculated difference of the positions of the mark and the deflection data and incident angle relation stored in the relation storing unit 63; a deflection efficiency correction data storing unit 65 for storing correction data for the deflection efficiency in accordance with the change of height of a sample found in advance; and a deflection efficiency correcting unit 66 for calculating the correction value from the calculated height and the correction data of the deflection efficiency stored in the deflection efficiency correction data storing unit and correcting the deflection efficiency of the processing circuits.

Figure 1:
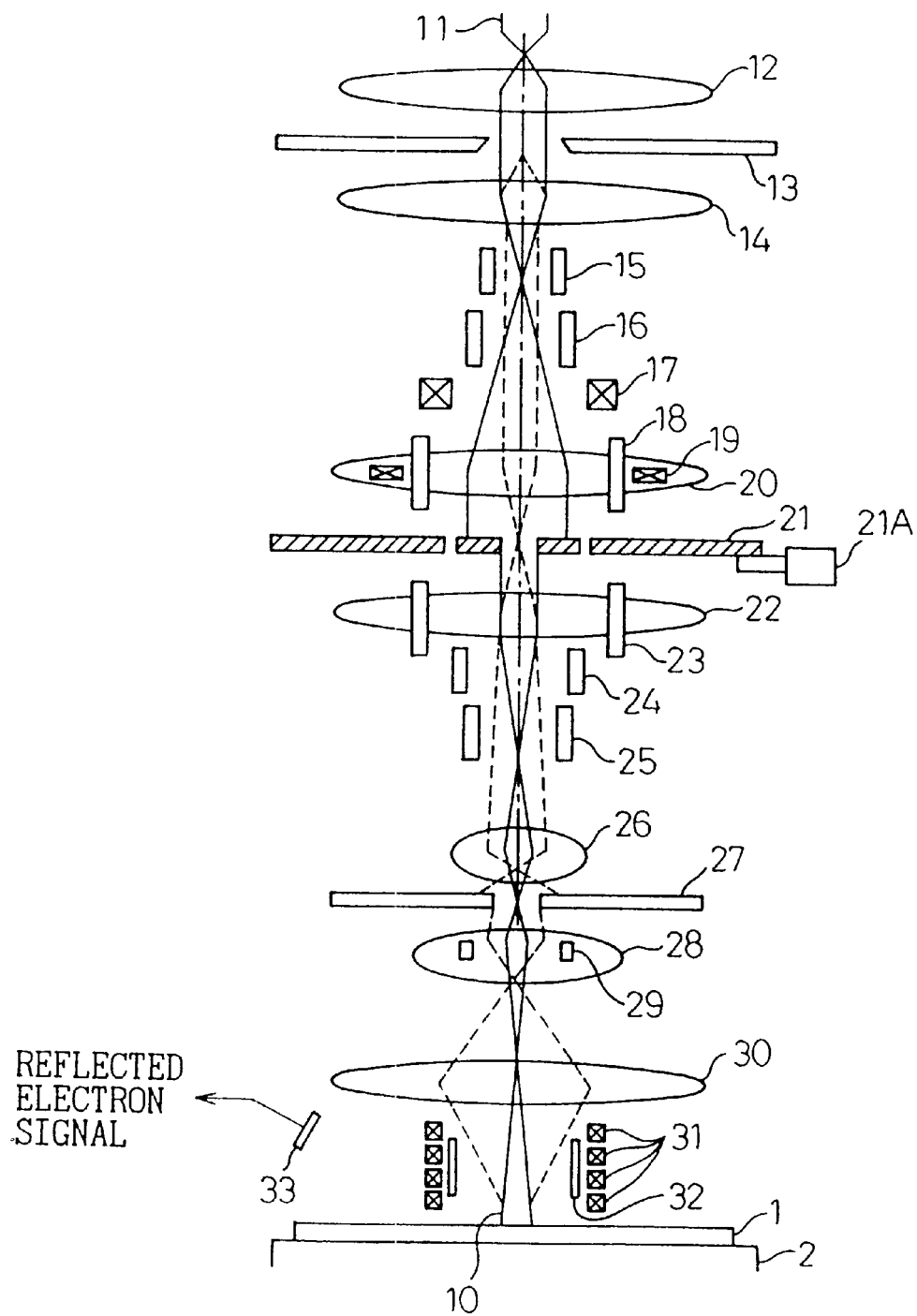
FIG. 1 is a view of the configuration of an electron optical column of an electron beam exposure apparatus.

The mark position detecting unit 61 is comprised of the reflected electron detector 33 of FIG. 1 and a scanning signal generator for generating a signal for scanning of the electron beam etc. The scanning signal generator, mark position difference calculating unit 62, deflection data and incident angle relation storing unit 63, height calculating unit 64, deflection efficiency correction value storing unit 65, and deflection efficiency correcting unit 66 are realized by software of a computer, including the CPU 46 of FIG. 2, provided in the electron beam exposure apparatus, but may also be realized by hardware circuits.

Figure 9:
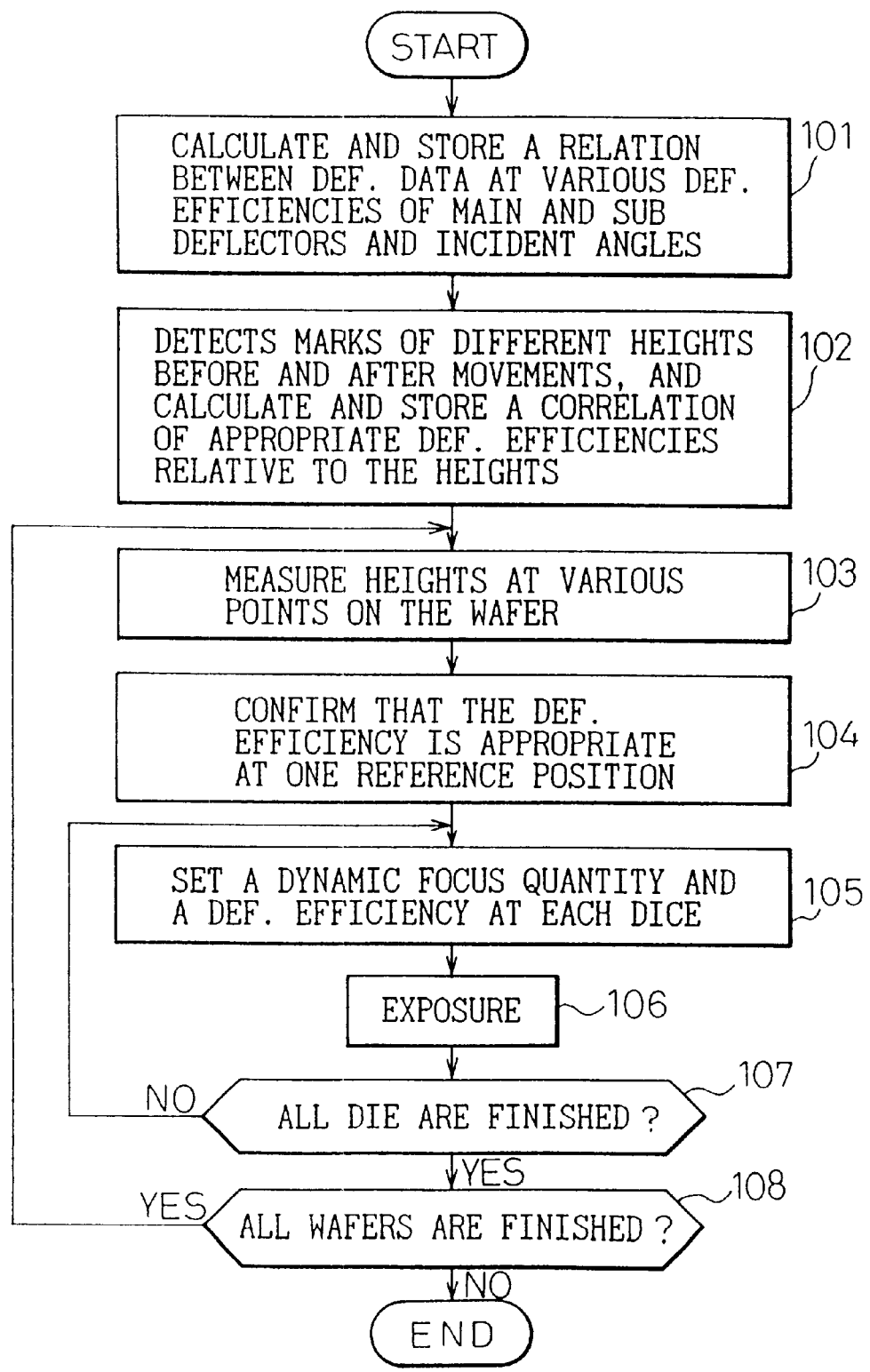
FIG. 9 is a flow chart of the processing for height measurement and correction of the deflection efficiency for exposure in the first embodiment.

FIG. 9 is a flow chart of processing for height measurement of a sample and correction of the focus position and deflection efficiency in the electron beam exposure apparatus of the present embodiment.

At step 101, the relationship of the incident angle with respect to the deflection data at various deflection efficiencies is calculated and stored for the main deflection and the sub deflection. This relationship may for example be predicted by simulation of an electron optical system. Even when stored in the form of a lookup table, storage is possible in the form of a formula giving the incident angle by substitution of the deflection efficiency and the deflection data.

At step 102, a sample (wafer) having a plurality of marks at different heights is moved by a stage, the positions of the marks are detected before and after the movement, and the correspondence of the deflection efficiencies best for the different heights is found and stored. In this case, it is also possible to change the height of the stage to change the height of the marks. Further, the correspondence may be stored in the form of a lookup table or may be stored in the form of a formula giving the correction value of the deflection efficiency by substitution of the height. Note that when measuring the height of a mark, it is also possible to use the method of measurement of the height of a sample (mark) of the present invention.

At step 103, the heights of different points of the sample (wafer) are measured by the method of height measurement of the present invention explained up to here. This will be explained in further detail later. Note that here, the heights of predetermined points of semiconductor chips formed on the wafer are measured.

At step 104, the deflection efficiency at the height of a reference point serving as a reference found at step 103 is set from the height of the reference point and the correspondence stored at step 102. The same processing is performed as in step 102 to confirm the deflection efficiency set is the best. If not the best, it is necessary to redo steps 102 and 103.

At step 105, the value of the dynamic focus coil is set for each semiconductor chip and correction values of the deflection efficiencies in accordance with the heights of the semiconductor chips, found at steps 102 and 103, are calculated and the deflection efficiencies corrected.

At step 106, exposure is performed under the above set conditions.

At step 107, it is judged if the exposure has been finished for all semiconductor chips on the sample (wafer). If not finished, the routine returns to step 105. Note that when performing exposure while moving the stage, there are cases of performing the exposure successively for sub regions of the same column of dies, but in these cases the value of the dynamic focus coil is reset and the deflection efficiency corrected for each change of the semiconductor chip exposed.

At step 108, it is judged if the exposure has been finished for all wafers of a lot. If not finished, the routine returns to step 103. This means that after performing steps 101 and 102 once, the relation of the incident angle with respect to the deflection data at the various types of deflection efficiency obtained at steps 101 and 102 and the correspondence of the best deflection efficiency for the heights are used until exposure has been finished for all of the semiconductor chips on the wafer or the wafers in a lot. It is also possible however, when considering the stable production of electron beam exposure apparatus etc., to perform steps 101 and 102 at the time when the exposure of the semiconductor chips is finished or the time when the exposure of the wafers is finished.

Figure 3A:
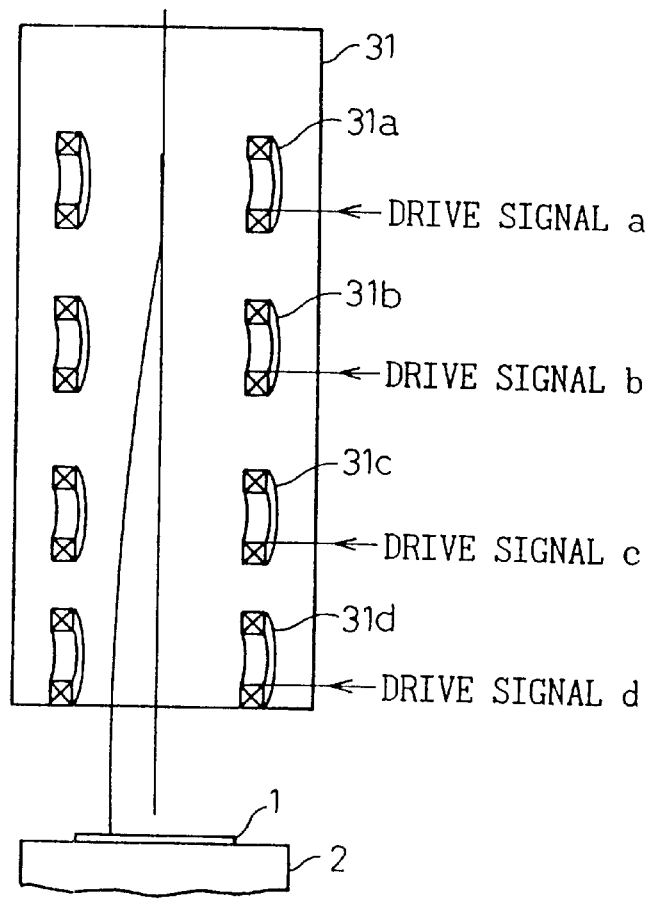
FIG. 3A is a view explaining deflection by a main deflector of the related art.
Figure 3B:
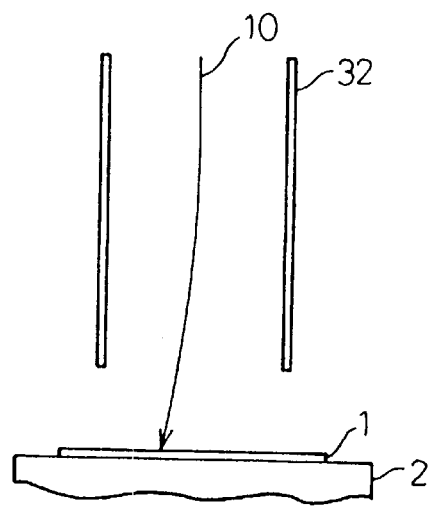
FIG. 3B is a view explaining deflection by a sub deflector of the related art.
Figure 6:
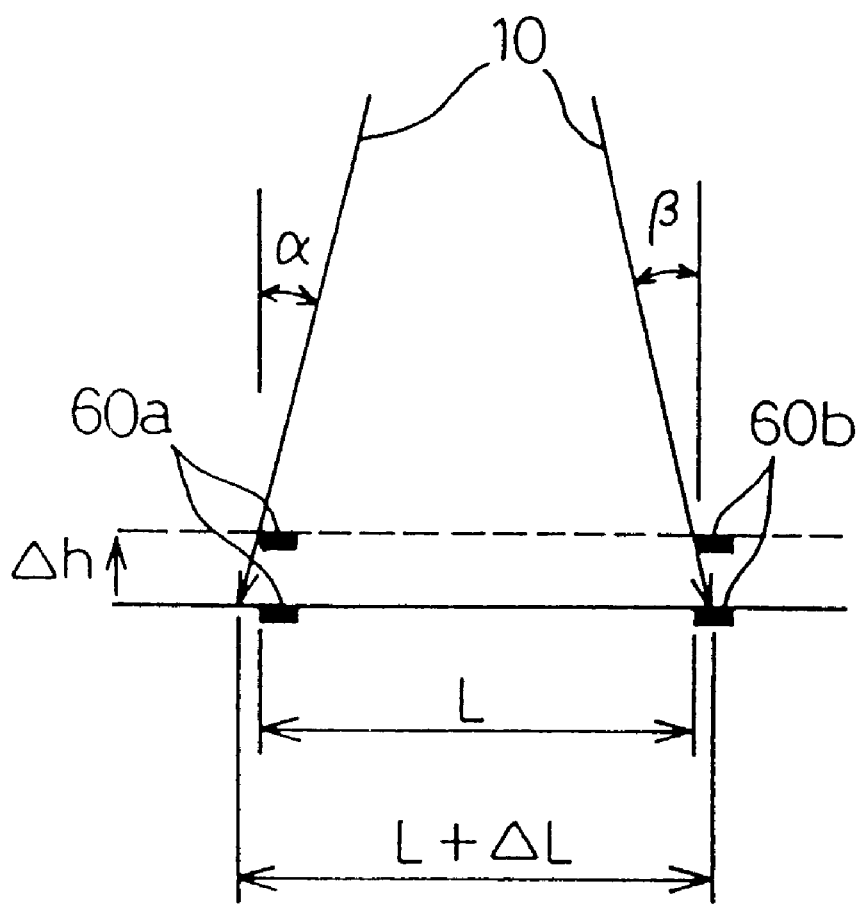
FIG. 6 is a view explaining the principle of height measurement of the present invention.
Figure 7A:
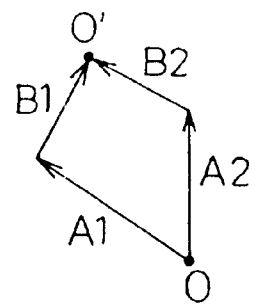
FIG. 7A and FIG. 7B are views explaining the principle of height measurement of one aspect of the present invention.
Figure 7B:
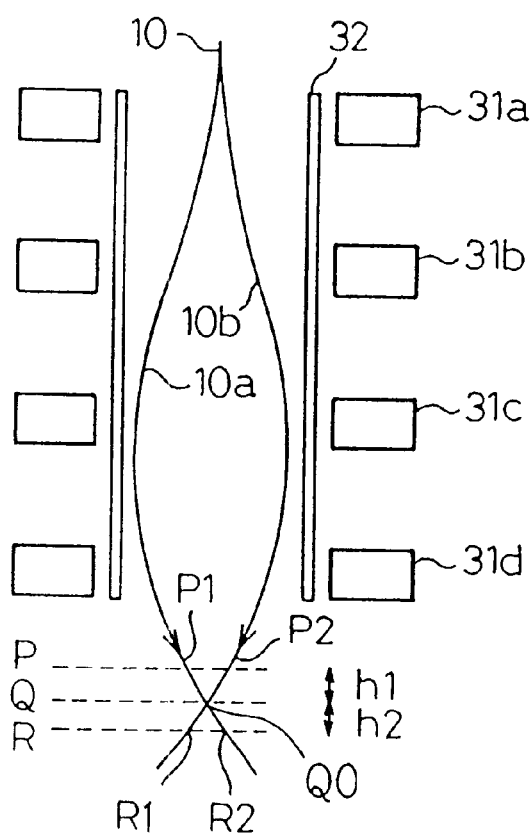

Next, an explanation will be made, with reference to FIG. 3A and FIG. 3B, of the height measurement of a sample (wafer) when using the main deflector 31 and the sub deflector 32 explained in FIG. 2. Note that in the case of an electromagnetic deflector as the main deflector 31, the path actually becomes spiral like, but here this form is shown for simplification of the explanation.

As explained above, the main deflector 31 is comprised of four electromagnetic deflectors 31a to 31d. After the direction is changed at a certain electromagnetic deflector, it is returned to the original direction by another electromagnetic deflector, whereby while the position of emission of the electron beam may change, the direction of emission will always be perpendicular to the sample. As opposed to this, in the case of deflection by the sub deflector 32, the electron beam striking the sub deflector 32 is gradually deflected and strikes the sample at a certain incident angle.

Figure 10A:
FIG. 10A to FIG. 10E are views of examples of combinations of the amounts of deflection of the main deflector and sub deflector facilitating calculation of the height in the case where the deflecting unit is comprised of a main deflector and a sub deflector.
Figure 10B:
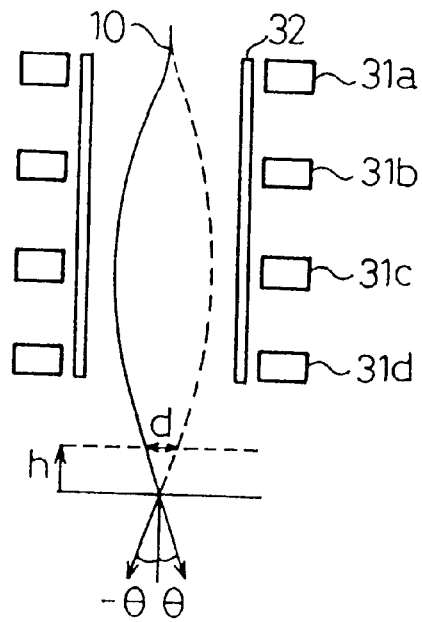

FIG. 10A to FIG. 10E are views of examples of combinations of amounts of deflection of the main deflector 31 and the sub deflector 32 giving combinations of two different incident angles. As shown in FIG. 10A, when the beam is deflected from the center (optical axis) O to the first direction by the main deflector by exactly A1 and is deflected in the direction opposite to the first direction by the sub deflector by exactly B1, the deflection position becomes the center O. Similarly, when the beam is deflected from the center O to a direction opposite to the first direction by the main deflector by exactly A2 and is deflected in the first direction by the sub deflector by exactly B2, the deflection position becomes the center O. That is, the two paths are symmetric. One path is one where the beam strikes the sample by an incident angle θ due to deflection by the sub deflector, while the other path is one where the beam strikes the sample at −θ. Therefore, if the height of the sample is deviated by exactly h, the position of the mark is deviated by exactly 2h×sin θ=d. Therefore, if finding θ by simulation and measuring d, the height h can be easily found.

Figure 10C:
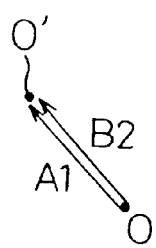
Figure 10D:
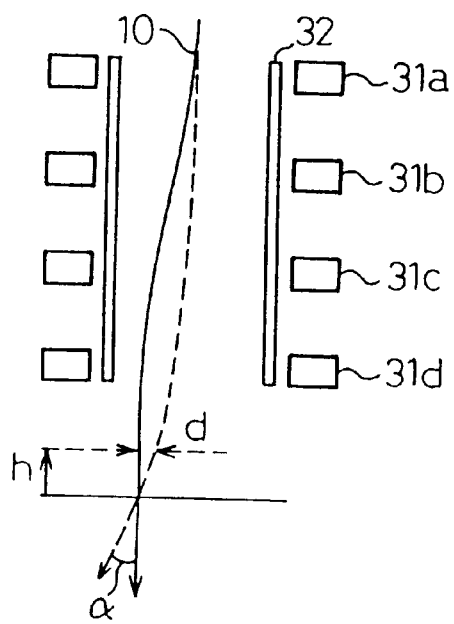

As shown in FIG. 10C, in the first combination, the amount of deflection of the main deflector is made A1 and the amount of deflection of the sub deflector is made zero, while in the second combination, the amount of deflection of the main deflector is made zero and the amount of deflection of the sub deflector is made B2 the same as A1. The path of the electron beam in this case, as shown in FIG. 10D, is one, in the first combination, of deflection by only the main deflector, so the electron beam is deflected, then returned and strikes the sample perpendicularly at the position of the amount of deflection A1. In the second combination, the beam strikes the sample at the incident angle α due to the deflection by the sub deflector. Therefore, if the height of the sample is deviated by exactly h, the position of the mark is deviated by exactly h×sin α=d. Therefore, if d is measured, the height h is easily found.

Figure 10E:
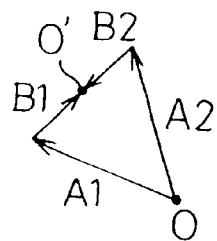

In FIG. 10A, the deflection position was made the center O, but even when making the deflection position a position O' other than the center, as shown in FIG. 10E, by making the amount of deflection by the sub deflector B1 and B2 opposite in signs, the two paths of the electron beam are ones where the beam strikes the sample at symmetric incident angles, so the height can be easily calculated.

Figure 11A:
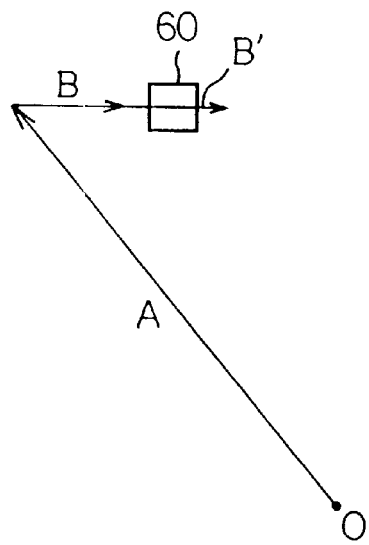
FIG. 11A and FIG. 11B are views explaining the method of detection of the position of an edge of a mark by scanning by an electron beam.
Figure 11B:
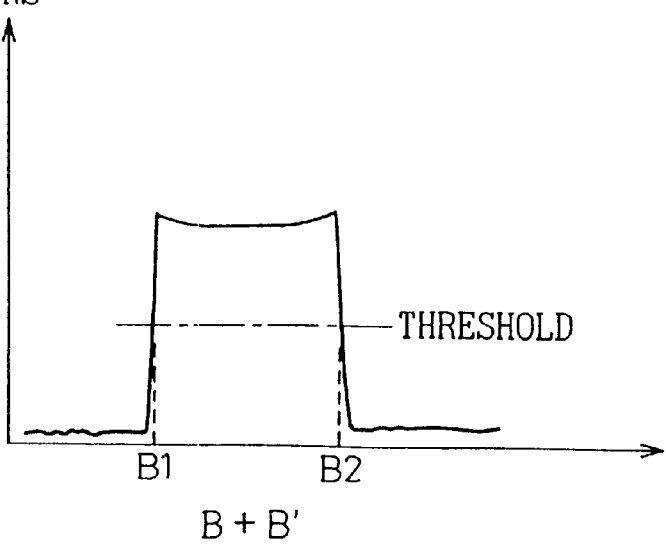

The mark is scanned, as shown in FIG. 11A, by making the amount of deflection of the main deflector with respect to the mark 60 become A and the amount of deflection of the sub deflector become B, then gradually changing the amount of deflection of the sub deflector to change the deflection position until the amount of deflection of the sub deflector becomes B+B'. The waveform of the change of the amount of reflected electrons at this time becomes as shown in FIG. 11B, so by setting the threshold level to between the levels of the portion of the mark and portions other than the mark, it is possible to detect the position of the edge of the mark with a relatively high accuracy. Note that when the height changes, the focus position is deviated, so the signal changes smoothly, but the reduction in the detection accuracy is small if setting the threshold level to an intermediate one. Note that the amount of deflection of the sub deflector at the time of detection of the edge is the actual amount of deflection. The incident angle is found from this value.

Above, the explanation was made of conditions for easily finding the height using a deflecting unit comprising a combination of a main deflector and a sub deflector of the related art, but the present invention is not limited to this. There are a plurality of combinations giving the same deflection position by combinations of amounts of deflection of two deflectors. The present invention can be applied to the case of different incident angles to the sample by such combinations. In this case, it is possible to find a formula for finding the deflection position and incident angle in accordance with the deflection data of the two deflectors and to find the height in accordance with this formula. Further, it is possible to find a correction formula for the deflection efficiency in accordance with the height for each deflection efficiency of the processing circuits and to correct the deflection efficiency in accordance with the height found.

As explained above, in the first embodiment of the present invention, it is possible to detect the height of a sample simpler and at a higher accuracy in an electron beam exposure apparatus with a deflecting unit comprised of a plurality of deflectors.

FIG. 12 is a block diagram of the schematic configuration of an electron beam exposure apparatus of a second embodiment of the present invention. In the second embodiment, the deflection efficiencies of the deflectors are changed at the time of exposure and the time of measurement of the height. The electron beam made to strike the sample as perpendicularly as possible at the time of exposure, while the electron beam is made to strike the sample at a large incident angle at the time of height measurement.

Reference numeral 8 shows a column holding the optical system of the electron beam shown in FIG. 1. In the figure, only the main deflector 31, sub deflector 32, sample (semiconductor wafer) 1, stage 2, stage movement mechanism 3, and reflected electron detector 33 are shown. The rest is omitted. Further, an actual apparatus provided with a plurality of computers is comprised with an overall controller for controlling the apparatus as a whole and an exposure data generator for generating exposure data from the exposure pattern etc., but these are also omitted.

The stage control circuit 4 controls the stage movement mechanism 3 able to move the stage in accordance with a control signal from the overall controller. The signal processing circuit 34 amplifies and processes the output signal of the reflected electron detector 33. The main deflection signal generation circuit 71 is a portion combining the main deflection first D/A amplifier 41a to main deflection fourth D/A amplifier 41d and the main deflection first processing circuit 42a to main deflection fourth processing circuit 42d of FIG. 2. The sub deflection signal generation circuit 72 is a portion combining the sub deflection D/A amplifier 43 and the sub deflection processing circuit 44. The CPU 73 corresponds to the CPU 46, while the deflection data management circuit 76 corresponds to the data management circuit 45. Therefore, the sub deflector 32 has eight electrodes, while the sub deflection signal generation circuit 72 is provided with a plurality of sub deflection D/A amplifiers 43 and sub deflection processing circuits 44 corresponding to the electrodes. Further, the mark position detecting unit 77 and height calculating unit 78 are provided, but these correspond to the mark position detecting unit 61 and the height calculating unit 64 of the first embodiment.

As illustrated, in this embodiment, the CPU 73 is provided with an exposure deflection efficiency storing unit 74 and a height measurement deflection efficiency storing unit 75. The exposure deflection efficiency storing unit 74 is a portion for computing and storing the deflection efficiency to be set at the main deflection first processing circuit to main deflection fourth processing circuit and the sub deflection processing circuit at the time of pattern exposure, while the height measurement deflection efficiency storing unit 75 is a portion for computing and storing the deflection efficiency to be set at the main deflection first processing circuit to the main deflection fourth processing circuit and the sub deflection processing circuit at the time of height measurement.

Figure 13:
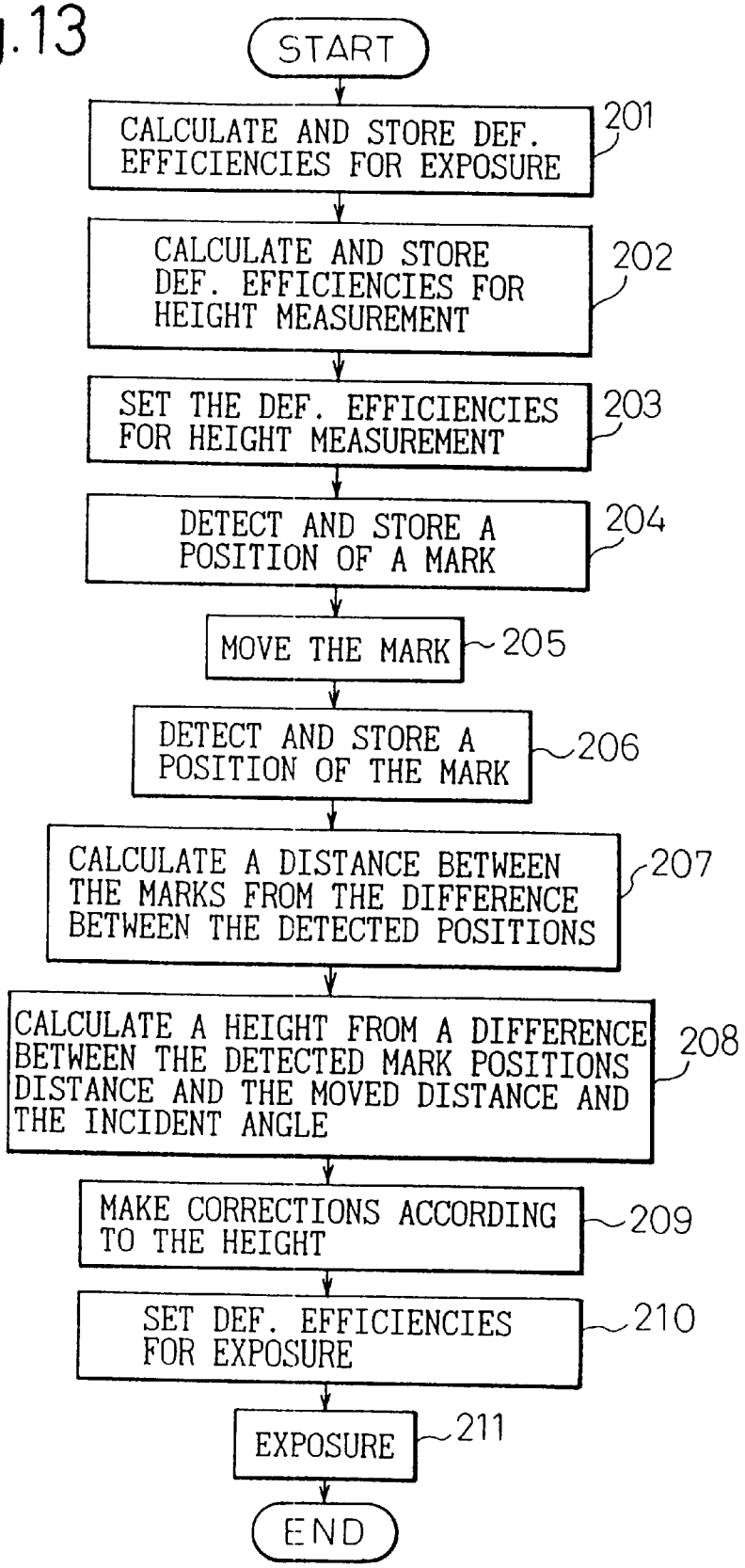
FIG. 13 is a flow chart of the processing for height measurement and exposure in the second embodiment.

FIG. 13 is a flow chart of the processing operation at the electron beam exposure apparatus of the second embodiment. The processing operation will be explained below in accordance with this flow chart.

Figure 14A:
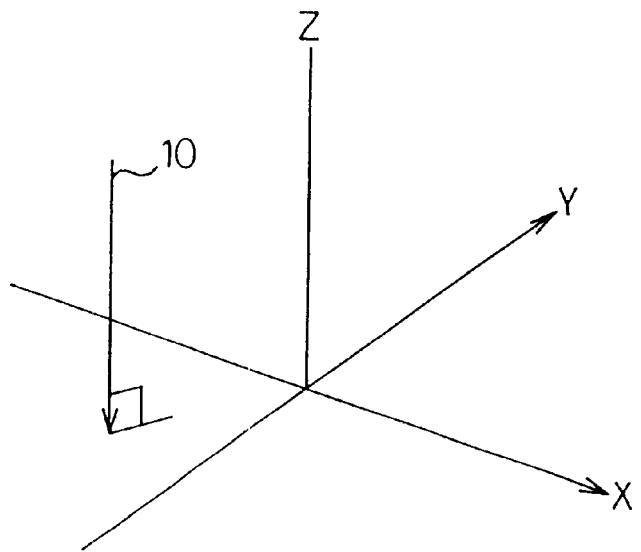
FIG. 14A and FIG. 14B are views of the states of incidence of an electron beam at the time of pattern exposure and time of height measurement.

At step 201, the exposure deflection efficiency storing unit 74 computes and stores the deflection efficiency to be set at the main deflection first processing circuit to main deflection fourth processing circuit and the sub deflection processing circuit at the time of pattern exposure. In this case, as shown in FIG. 14A, even in the case of deflection by a designated amount, the deflection efficiency is determined so that the incidence of the electron beam 10 to the wafer becomes substantially perpendicular. A detailed explanation of the determination of the deflection efficiency will follow later.

Note that the deflection efficiency is determined with respect to the height of the reference.

Figure 14B:
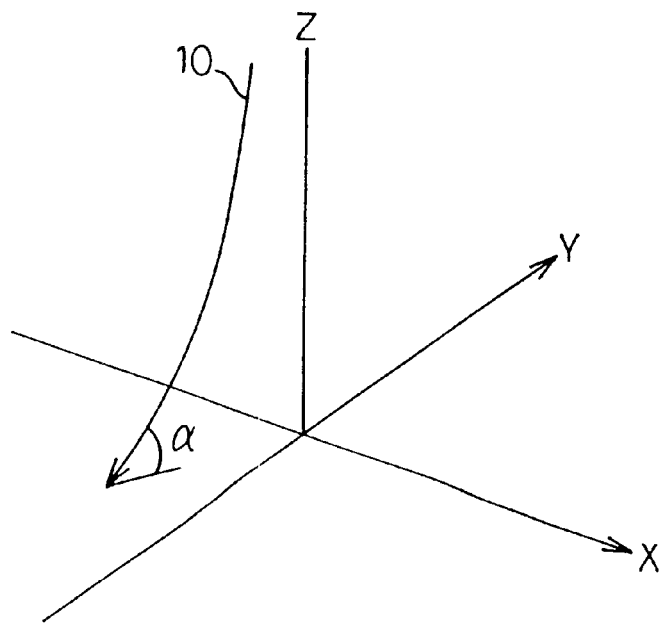

At step 202, the height measurement deflection efficiency storing unit 75 computes and stores the deflection efficiency to be set at the main deflection first processing circuit to the main deflection fourth processing circuit and the sub deflection processing circuit at the time of height measurement. In this case, as shown in FIG. 14B, the deflection efficiency is determined so that the incident angle α of the electron beam 10 to the wafer becomes larger. A detailed explanation of the determination of the deflection efficiency will follow later. Note that the incident angle of the electron beam to the wafer for deflection data at combinations with the deflection efficiencies is computed and stored at this time.

At step 203, the deflection efficiencies at the time of height measurement stored at step 202 are set in the main deflection first processing circuit to main deflection fourth processing circuit and the sub deflection processing circuit. At step 204, the position of the position detection mark is detected. The position of the position detection mark is detected by scanning by an electron beam while changing the deflection position near the position detection mark and detecting the edge of the position detection mark by detecting the change of the reflected electron detection signal. At step 205, the stage 2 is moved to move the mark. At this time, it is preferable to move the mark to a position symmetric with respect to the optical axis. The amount of movement of the stage is measured accurately by a laser interference measurement device and stored. At step 206, the position of the mark after movement is similarly detected.

At step 207, the difference in positions of the position detection mark before and after movement, detected at step 204 and step 206, is calculated to find the distance between the position detection mark before and after movement. At step 208, the difference between the distance between the position detection mark before and after movement found at step 207 and the distance of movement of the stage at step 205 is found and the difference of height from the reference height is calculated based on the incident angle of the electron beam to the wafer found at step 202.

At step 209, the focus of the electron beam is corrected in accordance with the difference of height calculated at step 208 and the coefficient of the deflection efficiency at the time of exposure is corrected. This is because if the focus position changes, the deflection efficiencies C1 to C4 and D (D1 to D8) of the main deflector 31 and the sub deflector 32 also change. For example, the optical axis also becomes inclined when the axis of the main deflector 31 or the sub deflector 32 becomes inclined along with mounting error, but if the optical axis is inclined, the center position becomes deviated in accordance with the focus position. This error is made as small as possible, but cannot be made completely zero. Therefore, the correspondence between the height of a sample and the deflection efficiency, that is, how much the deflection efficiencies C1 to C4 and D should be changed when the focus position changes, is found in advance and the correction value of the deflection efficiency is calculated from this correspondence.

At step 210, the corrected coefficient of the deflection efficiency at the time of exposure is set and exposure is performed at step 211.

Figure 15:
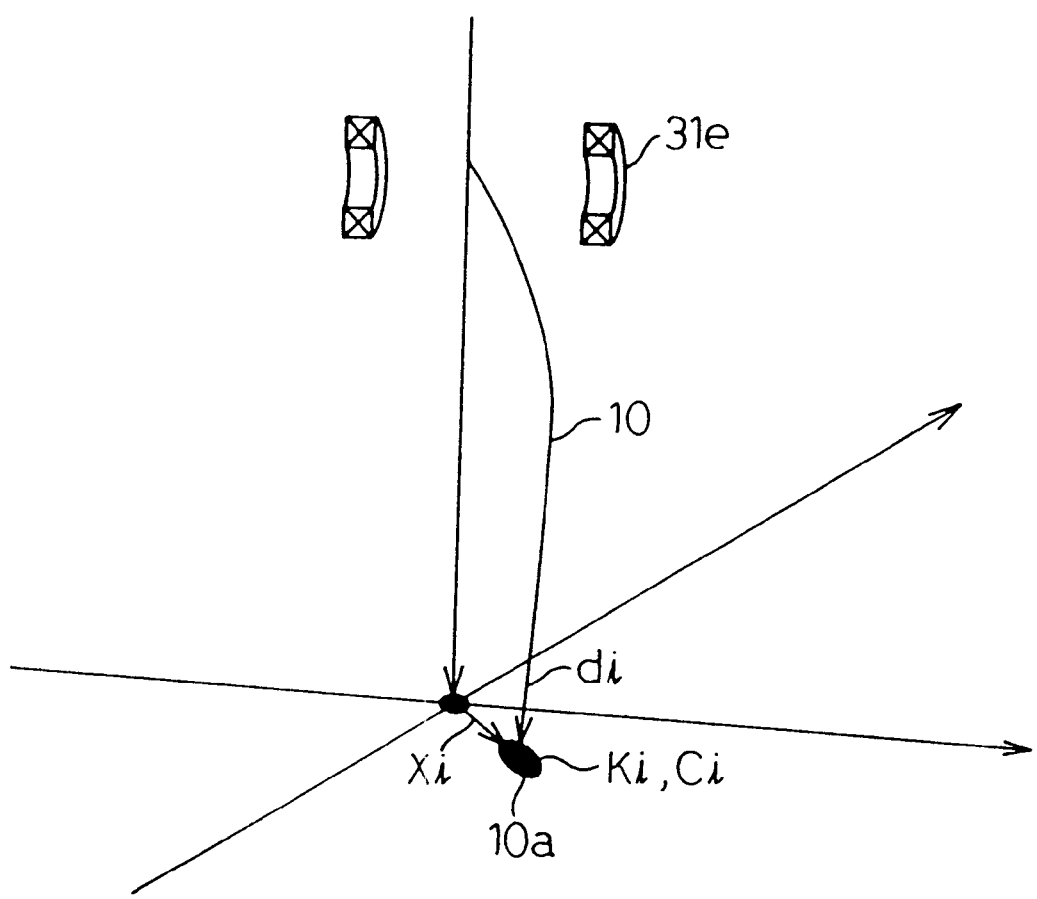
FIG. 15 is a view of the effect on a spot of an electron beam irradiated on a sample in the case of deflection by a deflector.

Next, an explanation will be made of the method of determination of the coefficient of deflection efficiency at the time of exposure and the time of height measurement. FIG. 15 is a view of the effect on the spot 10a of an electron beam irradiated on a wafer when deflecting an electron beam by one deflector. The first effect is the change in the position of irradiation on the wafer, that is, the change of the deflected position. The second effect is the change of the incident angle of the electron beam on the wafer surface. The third effect is the change of the blurring of the irradiated spot due to aberration. This aberration includes curvature of the image plane, astigmatism, deflection warping (distortion), frame aberration, deflection color aberration, etc. Aberration other than frame aberration and deflection color aberration can be corrected by an aberration correction lens of the electron optical system. Therefore, what becomes a problem in aberration is the frame aberration and deflection color aberration.

For example, the amount of deflection, incident angle, frame aberration, and color aberration in the case of deflection by one electromagnetic deflector is expressed as follows when the input to the electromagnetic deflector (excitation current) is made Ii:

$$\text{Amount of deflection } Xi = A \cdot Ii \tag{1}$$

$$\text{Incident angle } \alpha i = B \cdot Ii \tag{2}$$

$$\text{Frame aberration } Ki = k \cdot Ii \tag{3}$$

$$\text{Color aberration } Ci = D \cdot Ii \tag{4}$$

The above A, B, k, and D are constant vectors determined at the design stage of the optical system.

The same is true for an electrostatic deflector. Similar formulas are determined for the value of the voltage applied between electrodes.

The above amounts Xi, αi, Ki, and Ci may be predicted in simulation at the design stage.

When the deflection data is Xd and the deflection efficiency set at the processing circuit of the deflector is made Ei, Ii is Ei·Xd.

For example, when combining two deflectors, the amount of deflection, incident angle, frame aberration, and color aberration are expressed by the sums of those of the two deflectors. The amount of deflection and the incident angle are expressed by the following formulas:

$$\text{Amount of deflection } X = (A1 \cdot E1 + A2 \cdot E2) \cdot Xd \tag{5}$$

$$\text{Incident angle } \alpha = (B1 \cdot E1 + B2 \cdot E2) \cdot Xd \tag{6}$$

Therefore, since there are patterns where E1 and E2 are variable, it is possible to freely set the incident angle α after obtaining the predetermined amount of deflection. That is, the incident angle can be made zero or made a value other than zero by combination of E1 and E2.

In this embodiment, the main deflector is comprised of four electromagnetic deflectors. The amount of deflection X, the incident angle α, the frame aberration K, and the color aberration C are expressed by the following equations:

$$X = (A1 \cdot E1 + A2 \cdot E2 + A3 \cdot E3 + A4 \cdot E4) \cdot Xd \tag{7}$$

$$\alpha = (B1 \cdot E1 + B2 \cdot E2 + B3 \cdot E3 + B4 \cdot E4) \cdot Xd \tag{8}$$

$$K = (k1 \cdot E1 + k2 \cdot E2 + k3 \cdot E3 + k4 \cdot E4) \cdot Xd \tag{9}$$

$$C = (D1 \cdot E1 + D2 \cdot E2 + D3 \cdot E3 + D4 \cdot E4) \cdot Xd \tag{10}$$

In this case, since there are four variable parameters E1 to E4, the desired amount of deflection X in accordance with the deflection data Xd is obtained by formula (7). The incident angle α may be freely determined after satisfying the condition that the frame aberration K and the color aberration C be zero.

The deflection efficiencies E1 to E4 at the time of pattern exposure are determined so that the relationship X=P·Xd (where P is a unit vector) stands after the conditions that the incident angle α be zero and the frame aberration K and color aberration C be zero are met. The deflection efficiencies E1 to E4 at the time of height measurement are determined so that the relationship X=P·Xd stands after the condition that the incident angle α be a predetermined value and the frame aberration K and color aberration C be zero are met. The incident angle α is found from the accuracy required at height measurement and the accuracy of detection of the mark position. For example, if the accuracy for height measurement is 100 nm and the position detection accuracy is 5 nm, the incident angle α becomes 1/20 radians. If this is so, then at the time of pattern exposure, in a state where a good spot with a high sharpness is obtained, the electron beam strikes the wafer perpendicularly regardless of the deflection position, so there is no deterioration of the accuracy of arrangement of the exposure pattern due to changes in height and a good quality exposure pattern is obtained. Further, even at the time of height measurement, since the electron beam strikes the wafer by a large incident angle, the accuracy of height measurement becomes higher.

In the above example, the deflection efficiencies E1 to E4 at the time of height measurement were set so as to give an incident angle α of a predetermined value after the conditions of the frame aberration K and the color aberration C being zero are met, but this calculation is complicated, so when determining the deflection efficiencies E1 to E4 at the time of height measurement, it is possible to ignore the frame aberration K and color aberration C, make only one of the deflection efficiencies E1 to E4 a value other than zero, and make the other three values all zero. Doing this would facilitate the calculations.

Further, in the above example, four deflectors were provided and there were four variable parameters, but the present invention can be applied when there are as little as two deflectors. For example, if there are two deflectors, the frame aberration and color aberration cannot be adjusted, but it is possible to set things to give a predetermined relationship between the deflection data and the amount of deflection and then set the incident angle to zero (perpendicular incidence) at the time of pattern exposure or a large incident angle at the time of height measurement. As the number of the deflectors increases, the aberration can also be corrected and the sharpness improved. In the above way, if there are four deflectors, aberration can be completely adjusted, but if there are five or more deflectors, the degree of freedom of determination of the deflection efficiencies is increased.

As explained above, in the second embodiment, it is possible to detect the height of a sample simpler and with a higher accuracy in an electron beam exposure apparatus with a deflecting unit comprised of a plurality of deflectors.

We claim:

1. An electron beam exposure apparatus comprising:
    an electron gun for emitting an electron beam;
    a convergence unit able to converge an electron beam on a sample and dynamically change the focus position;
    a deflecting unit for deflecting the electron beam, the deflecting unit including a plurality of deflectors and being able to deflect the same amount of deflection with different incident angles by combining the amounts of deflection of the plurality of deflectors;
    a movement mechanism for carrying and moving the sample;
    a mark position detecting unit for detecting a change in reflected electrons at a mark provided on the sample when scanning the mark by the electron beam and thereby detecting the position of the mark;
    a deflection data and incident angle relation storing circuit for storing a relationship between the deflection amount and the incident angles when the electron beam is deflected according to the combinations of the amounts of deflection of the plurality of deflectors;
    a mark position difference calculating unit for scanning the same mark arranged at the same position with different incident angles to detect the position of the same mark by using the mark position detecting unit and calculating the difference in the detected positions; and
    a height calculating unit for calculating the height of the sample from the difference of the detected positions and the difference between the incident angles.

2. The electron beam exposure apparatus as set forth in claim 1, wherein the different incident angles at the time of scanning the same mark are symmetric with respect to the perpendicular of the sample surface.

3. The electron beam exposure apparatus as set forth in claim 1, further comprising a focal distance correcting unit for correcting the focal distance of the converging unit in accordance with the detected height.

4. The electron beam exposure apparatus as set forth in claim 1, wherein the deflecting unit includes at least a main deflector having a large deflection range and a sub deflector having a deflection range smaller than the main deflector, the main deflector being provided with a plurality of electromagnetic deflectors arranged at different positions in the direction of the optical axis of the electron beam exposure apparatus and the sub deflector being an electrostatic deflector.

5. The electron beam exposure apparatus as set forth in claim 4, wherein when exposing a pattern on the sample, a region corresponding to the deflection range of the main deflector is divided into a plurality of sub regions corresponding to the deflection range of the sub deflector, the deflection position of the main deflector being set at the substantial center of the sub regions, the electron beam being deflected in the corresponding sub regions by the sub deflector for exposure.

6. An electron beam exposure apparatus comprising:
    an electron gun for emitting an electron beam;
    a convergence unit able to converge an electron beam on a sample and dynamically change the focus position;
    a deflecting unit for deflecting the electron beam;
    a movement mechanism for carrying and moving the sample;
    a mark position detecting unit for detecting a change in reflected electrons at a mark provided on the sample when scanning the mark by the electron beam and thereby detecting the position of the mark;
    wherein said deflecting unit includes:
       a plurality of deflectors;
       a plurality of processing circuits provided for deflectors, outputting deflection data multiplied with coefficients of deflection efficiencies, and enabling coefficients of deflection efficiency to be independently and freely set; and
       an analog processing circuit receiving the outputs of the processing circuits and generating drive signals for supply to the corresponding deflectors;
    an exposure deflection efficiency storing unit for computing and storing a combination of the coefficients of the deflection efficiencies for exposure by which the electron beam is deflected by exactly the amount of deflection defined by the deflection data and the incident angle of the electron beam to the sample surface becomes small;

a height measurement deflection efficiency storing unit for computing and storing a combination of the coefficients of the deflection efficiencies for height measurement by which the electron beam is deflected by exactly the amount of deflection defined by the deflection data and the incident angle of the electron beam to the sample surface becomes large;

a deflection data and incident angle relation storing circuit for storing the incident angle of the electron beam on the sample when the electron beam is deflected by the deflecting unit according to the combination of the coefficients of the deflection efficiencies for height measurement;

a mark position difference calculating unit for using the mark position detecting unit to scan a first mark provided on the sample by an electron beam of a first incident angle and a second mark in a predetermined positional relationship with the first mark by an electron beam of a second incident angle different from the first incident angle to detect the positions of the first and second marks and calculating the difference in the positional relationship of the first and second marks detected and the predetermined positional relationship, the first and second incident angles being obtained by setting the coefficients of the deflection efficiencies for height measurement; and a height calculating unit for calculating the height of the sample from the difference of the positional relationship and the relationship of the deflection data and the incident angle;

wherein deflection is performed by setting the coefficients of the deflection efficiencies for exposure in the plurality of the processing circuits at the time of pattern exposure to the sample; and wherein the combination of the coefficients of the deflection efficiencies for height measurement with a large incident angle is of all zeros except for one coefficient.

7. A method of exposure for an electron beam exposure apparatus having an electron gun for emitting an electron beam, a convergence unit able to converge an electron beam on a sample and dynamically change the focus position, a deflecting unit, a movement mechanism for carrying and moving the sample, and a reflected electron detector for detecting a change in reflected electrons at a mark provided on the sample when scanning the mark by the electron beam, comprising:

configuring the deflecting unit to have a plurality of deflectors and being able to deflect the electron beam by the same amount of deflection with different incident angles by combining the amounts of deflection of the deflectors;

storing in advance an incident angle of the electron beam when deflecting the electron beam by the deflecting unit;

scanning the same mark provided on the sample at the same position with different incident angles to detect the position of the same mark by the reflected electron detector;

calculating the difference in the positional relationship of the same mark detected by scanning with the different incident angles;

calculating the height of the sample from the difference of the positional relationship of the same mark calculated and the relationship of the deflection data and the incident angle; and making correction in accordance with the height of sample calculated.

8. The method of exposure as set forth in claim 7, wherein the different incident angles at the time of scanning the same mark are symmetric with respect to the perpendicular of the sample surface.

9. The method of exposure as set forth in claim 7, further comprising correcting the focal distance of the converging unit in accordance with the detected height.

10. A method of exposure for an electron beam exposure apparatus having an electron gun for emitting an electron beam, a convergence unit able to converge an electron beam on a sample and dynamically change the focus position, a deflecting unit for deflecting the electron beam, a movement mechanism for carrying and moving the sample, and a reflected electron detector for detecting a change in reflected electrons at a mark provided on the sample when scanning the mark by the electron beam, comprising:

configuring the deflecting unit to have a plurality of processing circuits provided for deflectors, outputting deflection data multiplied with coefficients of deflection efficiencies, and enabling coefficients of deflection efficiency to be independently and freely set, and an analog processing circuit receiving the outputs of the processing circuits and generating drive signals for supply to the corresponding deflectors;

computing and storing an combination of the coefficients of the deflection efficiencies for exposure, the electron beam being deflected by exactly the amount of deflection defined by the deflection data and the incident angle of the electron beam to the sample surface becoming small;

computing and storing a combination of the coefficients of the deflection efficiencies for height measurement by which the electron beam is deflected by exactly the amount of deflection defined by the deflection data and the incident angle of the electron beam to the sample surface becomes large;

storing in advance an incident angle of the electron beam when deflecting the electron beam by the deflecting unit according to the combination of the coefficients of the deflection efficiencies for height measurement;

scanning a first mark provided on the sample by said electron beam at a first incident angle obtained by setting the coefficients of the deflection efficiencies for height measurement and detecting the reflected electrons by the reflected electron detector to detect the position of the first mark;

scanning a second mark in a predetermined relationship with the first mark provided on the sample by said electron beam at a second incident angle, obtained by setting the coefficients of the deflection efficiencies for height measurement, different from the first incident angle and detecting the reflected electrons by the reflected electron detector to detect the position of the second mark;

calculating the difference in the positional relationship of the first and second marks detected and the predetermined positional relationship;

calculating the height of the sample from the difference of the positional relationship of the first and second marks calculated and the relationship of the deflection data and the incident angle;

making correction in accordance with the height of sample calculated;

wherein performing deflection includes setting the coefficients of the deflection efficiencies for exposure in the plurality of processing circuits at the time of pattern exposure to the sample;

storing correction data of the deflection efficiency for exposure in accordance with the height of a sample found in advance; and calculating the correction value from the calculated height and the correction data of the deflection efficiency stored in the deflection efficiency correction data storing unit and correcting the deflection efficiency of the processing circuits at the time of pattern exposure; and wherein the combination of the coefficients of the deflection efficiencies for height measurement with a large incident angle is of all zeros except for one coefficient.

11. A method of exposure for an electron beam exposure apparatus having an electron gun for emitting an electron beam, a convergence unit able to converge an electron beam on a sample and dynamically change the focus position, a deflecting unit for deflecting the electron beam, a movement mechanism for carrying and moving the sample, and a reflected electron detector for detecting a change in reflected electrons at a mark provided on the sample when scanning the mark by the electron beam, comprising:

configuring the deflecting unit to have a plurality of processing circuits provided for deflectors, outputting deflection data multiplied with coefficients of deflection efficiencies, and enabling coefficients of deflection efficiency to be independently and freely set, and an analog processing circuit receiving the outputs of the processing circuits and generating drive signals for supply to the corresponding deflectors;

computing and storing an combination of the coefficients of the deflection efficiencies for exposure, the electron beam being deflected by exactly the amount of deflection defined by the deflection data and the incident angle of the electron beam to the sample surface becoming small;

computing and storing a combination of the coefficients of the deflection efficiencies for height measurement by which the electron beam is deflected by exactly the amount of deflection defined by the deflection data and the incident angle of the electron beam to the sample surface becomes large;

storing in advance an incident angle of the electron beam when deflecting the electron beam by the deflecting unit according to the combination of the coefficients of the deflection efficiencies for height measurement;

scanning a first mark provided on the sample by said electron beam at a first incident angle obtained by setting the coefficients of the deflection efficiencies for height measurement and detecting the reflected electrons by the reflected electron detector to detect the position of the first mark;

scanning a second mark in a predetermined relationship with the first mark provided on the sample by said electron beam at a second incident angle, obtained by setting the coefficients of the deflection efficiencies for height measurement, different from the first incident angle and detecting the reflected electrons by the reflected electron detector to detect the position of the second mark;

calculating the difference in the positional relationship of the first and second marks detected and the predetermined positional relationship;

calculating the height of the sample from the difference of the positional relationship of the first and second marks calculated and the relationship of the deflection data and the incident angle;

making correction in accordance with the height of sample calculated;

wherein performing deflection includes setting the coefficients of the deflection efficiencies for exposure in the plurality of processing circuits at the time of pattern exposure to the sample;

storing correction data of the deflection efficiency for exposure in accordance with the height of a sample found in advance; and calculating the correction value from the calculated height and the correction data of the deflection efficiency stored in the deflection efficiency correction data storing unit and correcting the deflection efficiency of the processing circuits at the time of pattern exposure;

wherein the deflecting unit includes at least a main deflector having a large deflection range and a sub deflector having a deflection range smaller than the main deflector, the main deflector being provided with a plurality of electromagnetic deflectors arranged at different positions in the direction of the optical axis of the electron beam exposure apparatus, the sub deflector being an electrostatic deflector, and at the time of pattern exposure, the plurality of electromagnetic deflectors of the main deflector deflecting the electron beam to change once in direction of progression and then return to its original direction; and when calculating a combination of coefficients of deflection efficiencies for height measurement:

setting a combination of coefficients of deflection efficiencies where only one is a value not zero and the other coefficients are all zero and evaluating the sharpness of the image of the deflected electron beam on the sample;

changing the coefficient made zero and performing the above evaluation; and making the combination of the coefficients of deflection efficiencies giving the same incident angle and giving the smallest reduction in the sharpness the combination of the coefficients of the deflection efficiencies for height measurement.

12. A method of exposure for an electron beam exposure apparatus having an electron gun for emitting an electron beam, a convergence unit able to converge an electron beam on a sample and dynamically change the focus position, a deflecting unit for deflecting the electron beam, a movement mechanism for carrying and moving the sample, and a reflected electron detector for detecting a change in reflected electrons at a mark provided on the sample when scanning the mark by the electron beam, comprising:

configuring the deflecting unit to have a plurality of processing circuits provided for deflectors, outputting deflection data multiplied with coefficients of deflection efficiencies, and enabling coefficients of deflection efficiency to be independently and freely set, and an analog processing circuit receiving the outputs of the processing circuits and generating drive signals for supply to the corresponding deflectors;

computing and storing an combination of the coefficients of the deflection efficiencies for exposure, the electron beam being deflected by exactly the amount of deflection defined by the deflection data and the incident angle of the electron beam to the sample surface becoming small;

computing and storing a combination of the coefficients of the deflection efficiencies for height measurement by which the electron beam is deflected by exactly the amount of deflection defined by the deflection data and the incident angle of the electron beam to the sample surface becomes large;

storing in advance an incident angle of the electron beam when deflecting the electron beam by the deflecting unit according to the combination of the coefficients of the deflection efficiencies for height measurement;

scanning a first mark provided on the sample by said electron beam at a first incident angle obtained by setting the coefficients of the deflection efficiencies for height measurement and detecting the reflected electrons by the reflected electron detector to detect the position of the first mark;

scanning a second mark in a predetermined relationship with the first mark provided on the sample by said electron beam at a second incident angle, obtained by setting the coefficients of the deflection efficiencies for height measurement, different from the first incident angle and detecting the reflected electrons by the reflected electron detector to detect the position of the second mark;

calculating the difference in the positional relationship of the first and second marks detected and the predetermined positional relationship;

calculating the height of the sample from the difference of the positional relationship of the first and second marks calculated and the relationship of the deflection data and the incident angle;

making correction in accordance with the height of sample calculated;

wherein performing deflection includes setting the coefficients of the deflection efficiencies for exposure in the plurality of processing circuits at the time of pattern exposure to the sample;

storing correction data of the deflection efficiency for exposure in accordance with the height of a sample found in advance; and calculating the correction value from the calculated height and the correction data of the deflection efficiency stored in the deflection efficiency correction data storing unit and correcting the deflection efficiency of the processing circuits at the time of pattern exposure;

wherein the deflecting unit includes at least a main deflector having a large deflection range and a sub deflector having a deflection range smaller than the main deflector, the main deflector being provided with a plurality of electromagnetic deflectors arranged at different positions in the direction of the optical axis of the electron beam exposure apparatus, the sub deflector being an electrostatic deflector, and at the time of pattern exposure, the plurality of electromagnetic deflectors of the main deflector deflecting the electron beam to change once in direction of progression and then return to its original direction; and when calculating a combination of coefficients of deflection efficiencies for exposure, determining the combination of coefficients of deflection efficiencies under conditions, the incident angle of the electron beam to the sample surface always becoming zero without regard to the amount of deflection and sharpness of the image of the electron beam on the sample being the best by deflection of the main deflector; and when calculating the combination of the coefficients of deflection efficiencies for height measurement, determining the combination of coefficients of deflection efficiencies under conditions, the incident angle of the electron beam to the sample surface becoming a desired angle and the sharpness of the image of the electron beam on the sample being the best.

* * * * *